(12) United States Patent
Lee et al.

(10) Patent No.: US 9,602,093 B2
(45) Date of Patent: Mar. 21, 2017

(54) ZERO-CROSSING VOLTAGE DETECTION CIRCUIT AND METHOD THEREOF

(71) Applicant: GREEN SOLUTION TECHNOLOGY CO., LTD., New Taipei (TW)

(72) Inventors: Li-Min Lee, New Taipei (TW); Chao Shao, Wuxi (CN)

(73) Assignee: GREEN SOLUTION TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 14/836,950

(22) Filed: Aug. 26, 2015

(65) Prior Publication Data

US 2016/0087619 A1    Mar. 24, 2016

(30) Foreign Application Priority Data

Sep. 22, 2014  (CN) .......................... 2014 1 0488569

(51) Int. Cl.
*H03K 5/24*     (2006.01)
*H03K 5/1536*   (2006.01)
*H03K 17/13*    (2006.01)

(52) U.S. Cl.
CPC ............ *H03K 5/1536* (2013.01); *H03K 5/24* (2013.01); *H03K 5/2409* (2013.01); *H03K 5/2418* (2013.01); *H03K 17/13* (2013.01); *H03K 17/133* (2013.01)

(58) Field of Classification Search
CPC ...... H03K 5/1536; H03K 5/24; H03K 17/133; H03K 5/1534; H03K 5/2409; H03K 5/2418; H03K 5/2445; H03K 5/2481; H03K 17/13
See application file for complete search history.

(56) References Cited

U.S. PATENT DOCUMENTS

| | | | |
|---|---|---|---|
| 4,668,881 A * | 5/1987 | Piasecki | H03K 3/2885 327/52 |
| 9,128,497 B2 * | 9/2015 | Li | G05F 3/30 |
| 9,268,348 B2 * | 2/2016 | Yang | G05F 1/468 |
| 2006/0181336 A1 * | 8/2006 | Lee | G05F 3/30 327/539 |
| 2007/0046363 A1 * | 3/2007 | Tanzawa | G05F 3/30 327/539 |
| 2008/0084240 A1 * | 4/2008 | Passerini | G05F 3/30 327/539 |

* cited by examiner

*Primary Examiner* — Jung Kim
(74) *Attorney, Agent, or Firm* — CKC & Partners Co., Ltd.

(57) ABSTRACT

A zero-crossing voltage detection circuit for detecting a phase voltage of a converter includes a comparator, a first transistor and a second transistor. The first transistor has a first base, a first collector and a first emitter. The first base couples with the first collector. The first emitter receives the phase voltage. The first collector provides a first voltage to a first terminal of the comparator. The second transistor has a second base, a second collector and a second emitter. The second base couples with the first base. The second base couples with the second collector. The second emitter receives a ground voltage. The second collector provides a second voltage to a second terminal of the comparator. The comparator compares the first voltage with the second voltage to generate a zero-crossing voltage signal.

15 Claims, 7 Drawing Sheets

ZERO-CROSSING VOLTAGE DETECTION CIRCUIT AND METHOD THEREOF

RELATED APPLICATIONS

This application claims priority to Chinese Application Serial Number 201410488569.7, filed Sep. 22, 2014, which is herein incorporated by reference.

BACKGROUND

Field of Invention

The invention relates to a voltage detection circuit and method thereof, and particularly relates to a zero-crossing voltage detection circuit and method thereof.

Description of Related Art

Figure 1A:
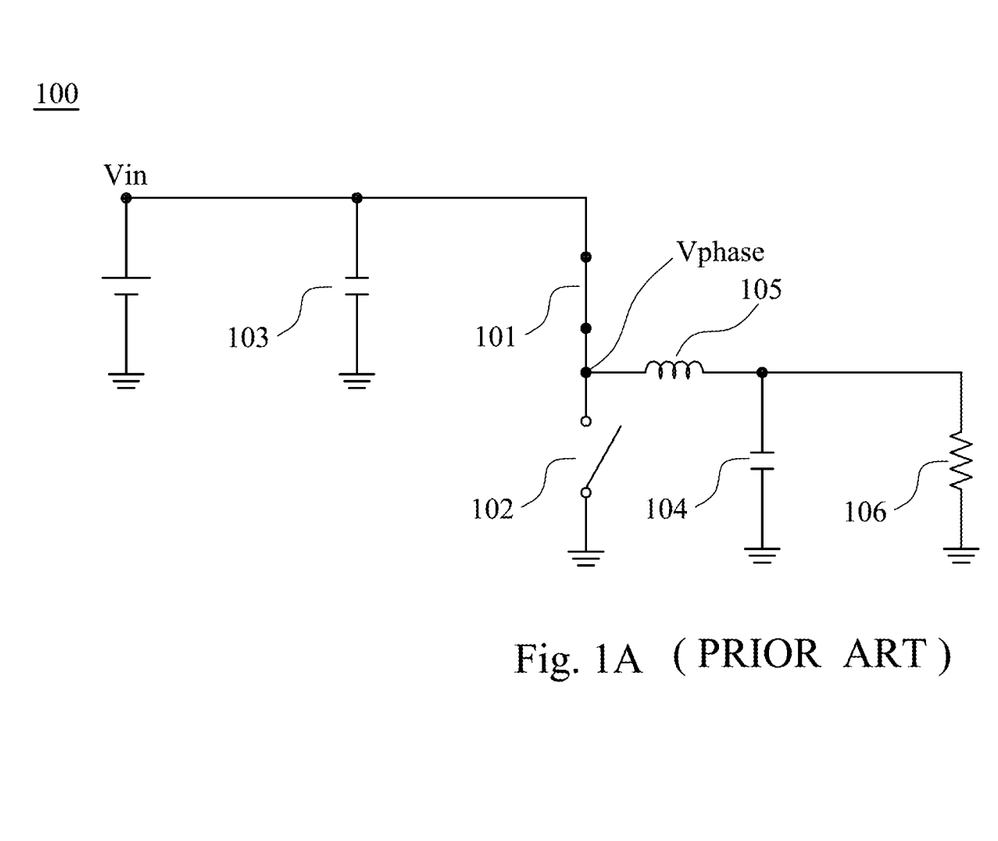
FIG. 1A and FIG. 1B illustrate a schematic diagram of a typical buck converter.
Figure 1B:
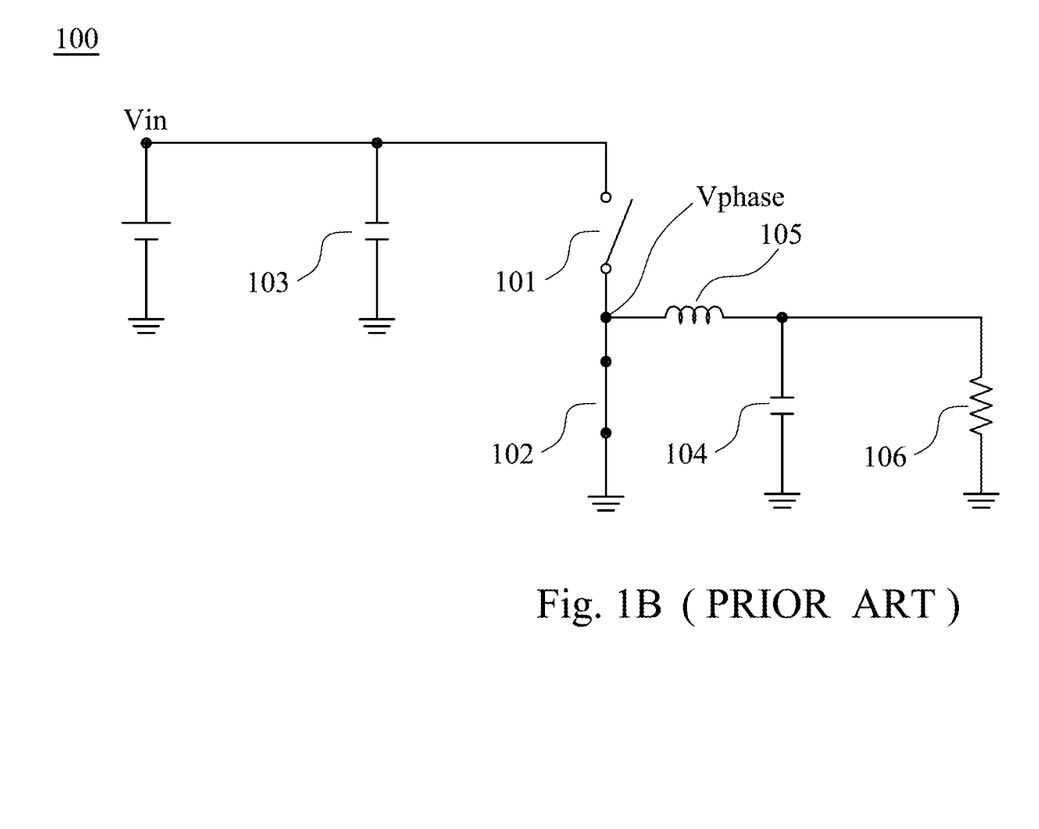

FIG. 1A and FIG. 1B illustrate a schematic diagram of a typical buck converter. The buck converter 100 comprises two switches 101 and 102, two capacitor 103 and 104 and an inductor 105, in which only one switch is turned on at any time. As shown in the FIG. 1A, when the switch 101 is turned on and the switch 102 is turned off, the inductor 105 is connected to the voltage source Vin. Therefore, the current is from the voltage source Vin to the load 106. Because the two terminals of the inductor 105 are positive voltage, the current is increased. When the switch 101 is turned off and the switch 102 is turned on, the inductor 105 is connected to the ground. Therefore, the current is from the ground to the load 106. Because the two terminals of the inductor 105 are negative voltage, the current is decreased. The energy stored in the inductor 105 is released to the load 106. In such a mode, the load 106 is a heavy load and the current of the inductor 105 is a positive current, which the mode is called as a continuous conduction mode (CCM). The phase voltage (Vphase) of the inductor 105 is less than zero. On the other hand, as shown in the FIG. 1B, when the switch 101 is turned off and the switch 102 is turned on and when the load 106 is a light load, the current of the inductor 105 is decreased. When the current is less than zero, the current is reversed. Therefore, the energy stored in the capacitor 104 is released. That is, the current is from the load 106 to the ground. Because the current in the inductor 105 is reduced to zero, such a mode is called as a discontinuous conduction mode (DCM). The phase voltage (Vphase) of the inductor 105 is larger than zero.

Figure 1C:
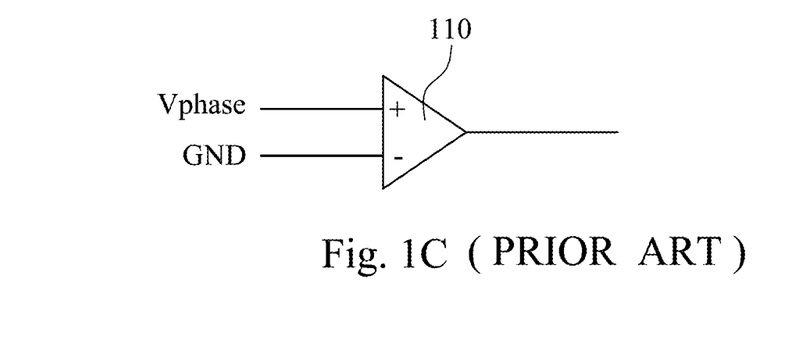
FIG. 1C is a schematic diagram of a typical zero-crossing voltage detection circuit.

Typically, a zero-crossing voltage detection circuit is used to detect the phase voltage (Vphase) of the inductor 105 to determine the operation mode, i.e., either a continuous conduction mode (CCM) for a heavy load or a discontinuous conduction mode (DCM) for a light load, of the buck converter to process a corresponding control to save energy. FIG. 1C is a schematic diagram of a typical zero-crossing voltage detection circuit. A comparator 110 compares the phase voltage (Vphase) of the inductor 105 with a ground voltage (GND) to determine when the phase voltage (Vphase) was approaching the zero crossing of the ground voltage (GND) so as to determine a corresponding operation mode, i.e., a continuous conduction mode (CCM) for a heavy load or a discontinuous conduction mode (DCM) for a light load.

The typical zero-crossing voltage detection circuit directly compares the phase voltage (Vphase) of the inductor 105 with a ground voltage (GND) to determine the time point of zero crossing, such that the detection velocity is fast. However, the comparators had variations that limited the accuracy of the comparators. Moreover, because the phase voltage (Vphase) and the ground voltage (GND) are directly inputted to the comparator, once the phase voltage (Vphase) has noise, the noise reduces the accuracy of detection. Accordingly, it is desirable to have a zero-crossing voltage detection circuit that has improved accuracy and that more accurately detects the zero crossing of a signal.

SUMMARY

Accordingly, the present invention provides a zero-crossing voltage detection circuit and method to enlarge the difference between the phase voltage (Vphase) and the ground voltage (GND) to reduce the influence of environment.

The present invention provides a zero-crossing voltage detection circuit for detecting a phase voltage of a converter. The zero-crossing voltage detection circuit comprises a comparator, a first transistor and a second transistor. The comparator has a first terminal and a second terminal. The first transistor has a first base, a first collector and a first emitter. The first base couples with the first collector. The first emitter receives the phase voltage. The first collector provides a first voltage to the first terminal of the comparator. The second transistor has a second base, a second collector and a second emitter. The second base couples with the first base. The second base couples with the second collector. The second emitter receives a ground voltage. The second collector provides a second voltage to the second terminal of the comparator. The comparator compares the first voltage with the second voltage to generate a zero-crossing voltage signal.

In an embodiment, the zero-crossing voltage detection circuit further comprises a first current source coupling with the first collector and a second current source coupling with the second collector. In an embodiment, the current provided by the first current source is equal to that provided by the second current source.

In an embodiment, the zero-crossing voltage detection circuit further comprises a first resistor coupling with the first emitter and a second resistor coupling with the second emitter, in an embodiment, the resistance of the first resistor is equal to that of the second resistor.

In an embodiment, the zero-crossing voltage detection circuit further comprises an increment resistor coupling with the first resistor in series and a first switch coupling with the increment resistor in parallel. When the first switch is turned on, a bypass route is generated to cause the first resistor to connect to the first emitter through the bypass route. When the first switch is turned off, the increment resistor coupling with the first resistor in series to connect to the first emitter.

In an embodiment, the zero-crossing voltage detection circuit further comprises a latch circuit to control the on/off of the first switch. When the converter is controlled in a continuous conduction mode (CCM), the first switch is turned on. When the converter is controlled in a discontinuous conduction mode (DCM), the first switch is turned off.

In an embodiment, when the zero-crossing voltage signal is zero, the latch circuit outputs a low-level signal to turn off the first switch. When the zero-crossing voltage signal is a clock signal, the latch circuit outputs a high-level signal to turn on the first switch.

In an embodiment, the zero-crossing voltage detection circuit further comprises a third resistor and a fourth resistor. The first base couples to the first collector through the third resistor. The second base couples to the second collector through the fourth resistor. The resistance of the third resistor is equal to that of the fourth resistor.

In an embodiment, the zero-crossing voltage detection circuit further comprises a start switch to receive the phase voltage. When a start signal turns on the start switch, a bypass route is generated to remove the phase voltage through the bypass route to mask the detection result the zero-crossing voltage detection circuit. When the start signal turns off the start switch, the phase voltage is transferred to the first emitter to make the zero-crossing voltage detection circuit operate in a normal state.

The present invention provides a zero-crossing voltage detection method for detecting a phase voltage of a converter. The zero-crossing voltage detection method comprises to provide a first transistor with a first base, a first collector and a first emitter. The phase voltage is coupled to the first emitter to make the first base couple with the first collector to generate a first voltage in the first collector. Then, a second transistor with a second base, a second collector and a second emitter is provided. A ground voltage is coupled to the second emitter to make the second base couple with the second collector to generate a second voltage in second collector. The second base couples with the first base. Next, the first voltage is compared with the second voltage to generate a zero-crossing voltage signal.

In an embodiment, the zero-crossing voltage detection method further comprises to provide an increment resistor coupling with the first collector in series and provide a first switch coupling with the increment resistor in parallel.

In an embodiment, the zero-crossing voltage detection method further comprises to provide a latch circuit to control the on/off of the first switch.

In an embodiment, the zero-crossing voltage detection method further comprises to provide a start switch to receive the phase voltage. When a start signal turns on the start switch, a bypass route is generated to remove the phase voltage through the bypass route. When the start signal turns off the start switch, the phase voltage is transferred to the first emitter.

Accordingly, by enlarging the difference between the phase voltage (Vphase) and the ground voltage (GND), the inaccuracy detecting because of the variations resulting from the comparator's dc offset may be reduced. The comparing velocity of the comparator is also improved. Moreover, the inaccuracy detecting because of the change of phase voltage resulting from time delay for charging capacitors among different operations is also smoothed.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 2:
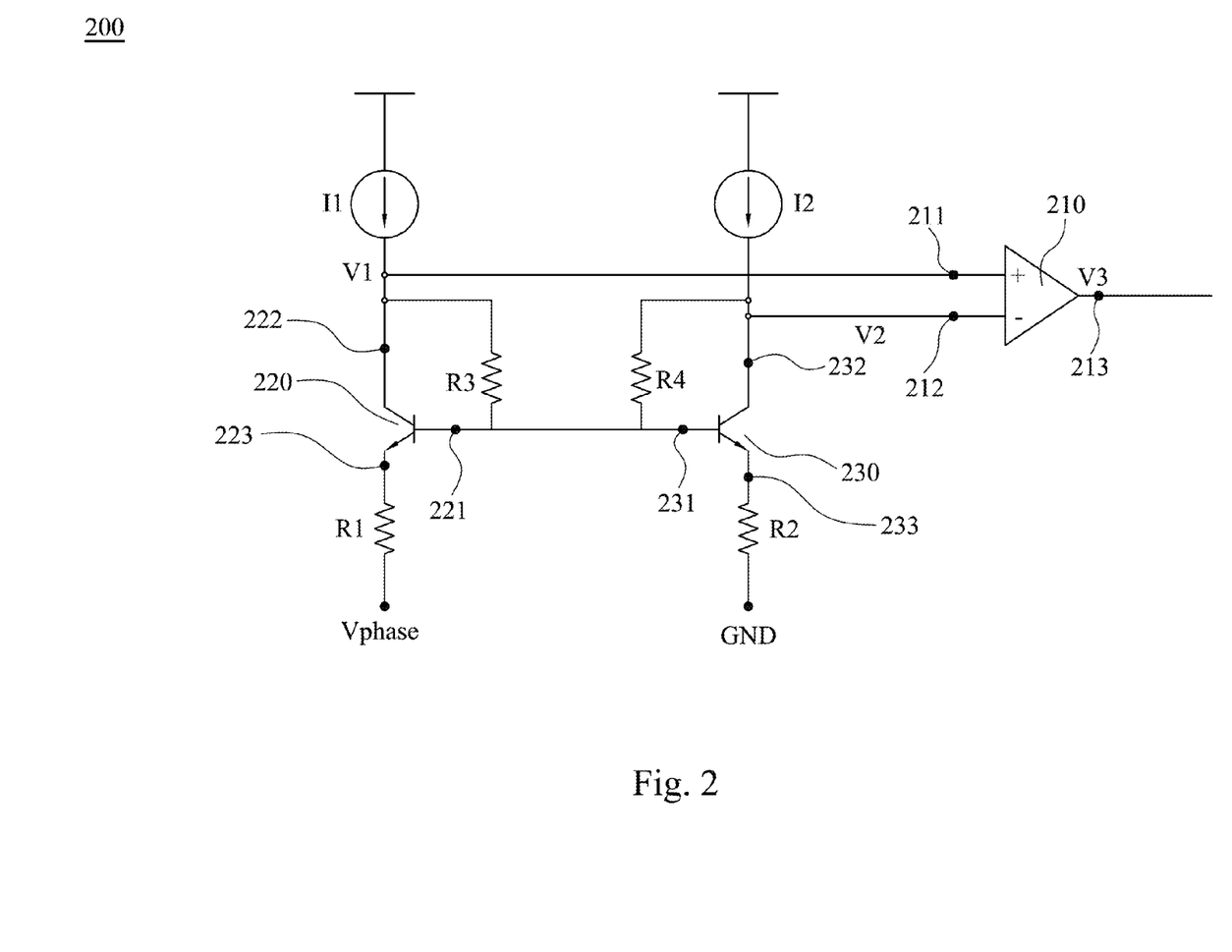
FIG. 2 illustrates a schematic diagram of a zero-crossing voltage detection circuit according to an embodiment of the invention.

FIG. 2 illustrates a schematic diagram of a zero-crossing voltage detection circuit according to an embodiment of the invention. The zero-crossing voltage detection circuit 200 comprises a comparator 210, a first transistor 220 and a second transistor 230. In an embodiment, the first transistor 220 and the second transistor 230 are bipolar junction transistors (BJT). The comparator 210 has a first terminal and a second terminal. In an embodiment, the first terminal is a positive terminal 211 to receive the first voltage (V1) generated by the phase voltage (Vphase), and the second terminal is a negative terminal 212 to receive the second voltage (V2) generated by the ground voltage (GND). The comparator 210 compares the first voltage (V1) with the second voltage (V2) to determine when the phase voltage (Vphase) was approaching the zero crossing of the ground voltage (GND) so as to generate a zero-crossing voltage signal (V3) at the output terminal 213 to control the corresponding power supply to save energy. In another embodiment, the positive terminal 211 receives the second voltage (V2) generated by the ground voltage (GND) and the negative terminal 212 receives the first voltage (V1) generated by the phase voltage (Vphase) to generate a zero-crossing voltage signal (V3) at the output terminal 213. The operation method and circuit structure are similar to the above embodiment. This description will not be repeated depict in here.

The first transistor 220 has a first base 221, a first collector 222 and a first emitter 223. The first base 221 couples with the first collector 222. The first emitter 223 receives the phase voltage (Vphase). The first collector 222 provides a first voltage (V1) to the positive terminal 211 of the comparator 210.

The second transistor 230 has a second base 231, a second collector 232 and a second emitter 233. The second base 231 couples with the first base 221 of the first transistor 220. The second base 231 couples with the second collector 232. The second emitter 233 receives a ground voltage (GND). The second collector 232 provides a second voltage (V2) to the negative terminal 212 of the comparator 210.

The comparator 210 compares the first voltage (V1) with the second voltage (V2) to generate a zero-crossing voltage signal (V3). In an embodiment, when the zero-crossing voltage signal (V3) is less than zero, that is the phase voltage (Vphase) is less than the ground voltage (GND), the zero-crossing voltage signal (V3) is a heavy load zero-crossing voltage signal, which means a heavy load is connected to the converter. The operation mode of the converter is a continuous conduction mode (CCM). On the other hand, when the zero-crossing voltage signal (V3) is larger than zero, that is the phase voltage (Vphase) is larger than the ground voltage (GND), the zero-crossing voltage signal (V3) is a light load zero-crossing voltage signal, which means a light load is connected to the converter. The operation mode of the converter is a discontinuous conduction mode (DCM). The converter is a buck converter, a boost converter, or a buck-booster converter.

The zero-crossing voltage detection circuit 200 further comprises a first current source (I1), a second current source (I2), a first resistor (R1), a second resistor (R2), a third resistor (R3) and a fourth resistor (R4). The first resistor (R1) couples with the first emitter 223 of the first transistor 220. Therefore, the phase voltage (Vphase) is transferred to the first emitter 223 of the first transistor 220 through the first resistor (R1). The second resistor (R2) couples with the second emitter 233 of the second transistor 230. Therefore, the ground voltage (GND) is transferred to the second emitter 233 of the second transistor 230 through the second resistor (R2). The third resistor (R3) is disposed between the first base 221 and the first collector 222 of the first transistor 220. Therefore, the first base 221 couples to the first collector 222 through the third resistor (R3). The fourth resistor (R4) is disposed between the second base 231 and the second collector 232 of the second transistor 230. The second base 231 couples to the second collector 232 through the fourth resistor (R4).

The first current source (I1) couples with the first collector 222 of the first transistor 220. The second current source (I2) couples with the second collector 232 of the second transistor 230. Accordingly, the first voltage (V1) related to the phase voltage (Vphase) is generated at the first collector 222 of the first transistor 220 according to the current from the first current source (I1) at the first collector 222 and the phase voltage (Vphase) at the first emitter 223. Moreover, the second voltage (V2) related to the ground voltage (GND) is generated at the second collector 232 of the second transistor 230 according to the current from the second current source (I2) at the second collector 232 and the ground voltage (GND) at the second emitter 233.

In an embodiment, the first resistor (R1) and the second resistor (R2) have same resistance, RA. The third resistor (R3) and the fourth resistor (R4) have same resistance, RB. The voltage of the first base 221 of the first transistor 220 and the second base 231 of the second transistor 230 is Vb. The current of the third resistor (R3) is $I_{R3}$. The current of the fourth resistor (R4) is $I_{R4}$. The current of the first base 221 of the first transistor 220 is $I_{BQ1}$. The current of the first collector 222 of the first transistor 220 is $I_{CQ1}$. The current of the first emitter 223 of the first transistor 220 is $I_{EQ1}$. The current of the second base 231 of the second transistor 230 is $I_{BQ2}$. The current of the second collector 232 of the second transistor 230 is $I_{CQ2}$. The current of the second emitter 233 of the second transistor 230 is $I_{EQ2}$. The voltage difference of the two terminals of the first resistor (R1) is VR1. The voltage difference of the two terminals of the second resistor (R2) is VR2. Because the voltage (Vb1) at the first base 221 is equal to the voltage (Vb2) at the second base 231, and the voltage (Vbe1) between the first base 221 and the first emitter 223 is almost equal to the voltage (Vbe2) between the second base 231 and the second emitter 233, the voltage (Ve1) at the first emitter 223 of the first transistor 220 is almost equal to the voltage (Ve2) at the second emitter 233 of the second transistor 230.

The voltage (Ve1) is described as follows:

$Ve1=Vphase+VR1=Ve2=GND+VR2$ $VR2-VR1=Vphase-GND$

The voltage difference between the first voltage (V1) and the second voltage (V2) is described as follows:

$$V1-V2 = Vb + I_{R3}*R3 - (Vb + I_{R4}*R4)$$
$$= (I_{R3} - I_{R4})*RB$$
$$= ((I1 - I_{CQ1}) - (I1 - I_{CQ2}))*RB$$
$$= (I_{CQ2} - I_{CQ1})*RB$$
$$= \beta*(I_{BQ2} - I_{BQ1})*RB$$
$$= \beta/(1+\beta)*(I_{EQ2} - I_{EQ1})*RB$$
$$= \beta/(1+\beta)*(V_{R2} - V_{R1})/RA*RB$$
$$= \beta/(1+\beta)*Vphase*RB/RA$$

Accordingly, the voltage difference between the positive terminal 211 and the negative terminal 212 of the comparator 210 is as follows:

$V1-V2=\beta/(1+\beta)*Vphase*RB/RA$

Therefore, the voltage difference between the positive terminal 211 and the negative terminal 212 of the comparator 210 is not just a voltage difference between the phase voltage (Vphase) and the ground voltage (GND), but a voltage difference of which is enlarged by a factor RB/RA. That is, the voltage difference between the positive terminal 211 and the negative terminal 212 of the comparator 210 may be enlarged by selecting resistance of RB and RA. Accordingly, by enlarging the voltage difference, the inaccuracy detecting resulting from the variations of the comparator's dc offset may be reduced. The comparing velocity of the comparator is also improved. Moreover, because the voltage difference between the positive terminal 211 and the negative terminal 212 of the comparator 210 is enlarged, the inaccuracy detecting resulting from the change of phase voltage because of time delay for charging the capacitors among different operations is also smoothed. On the other hand, the parameter difference because of the structure difference between the first transistor 220 and the second transistor 230 is also smoothed.

Figure 3:
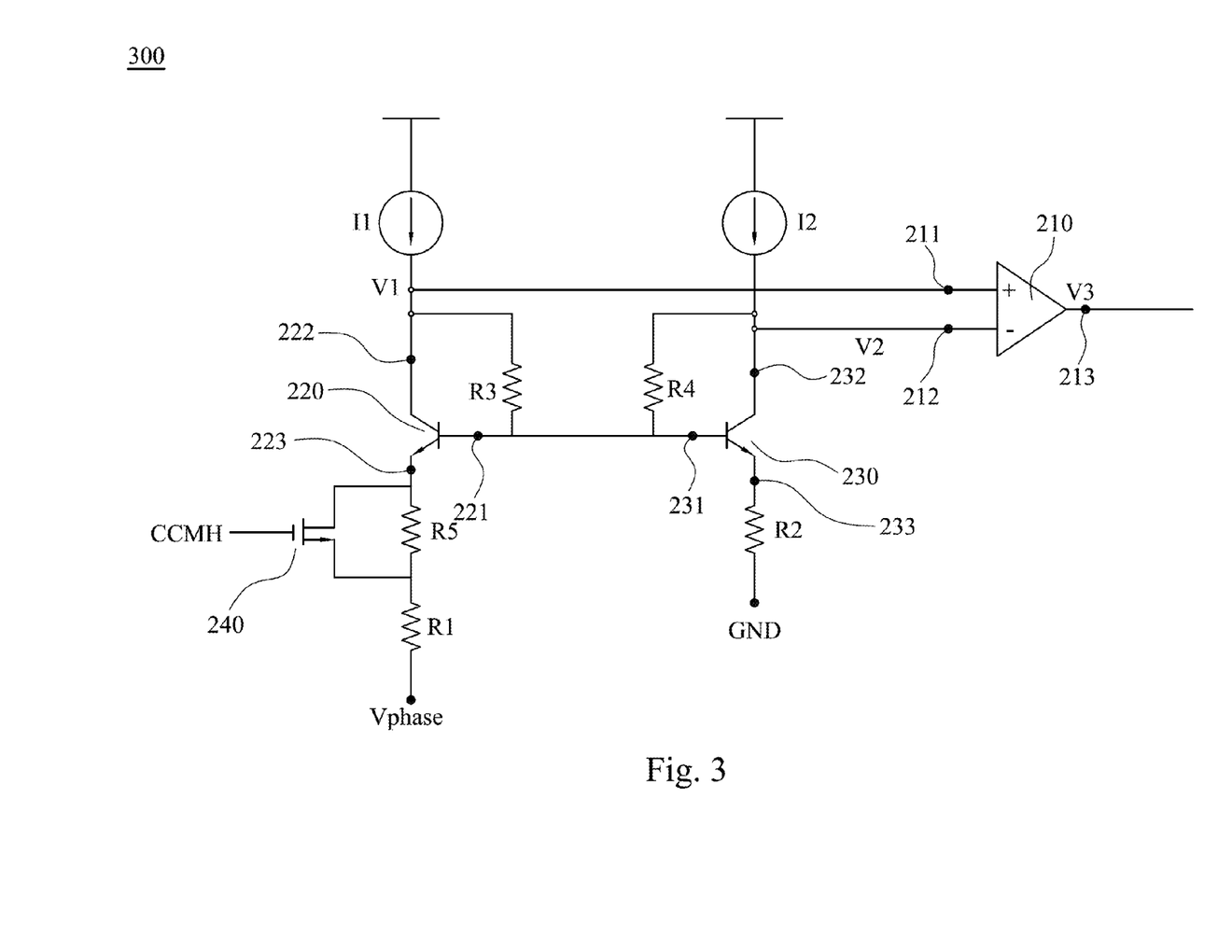
FIG. 3 illustrates a schematic diagram of a zero-crossing voltage detection circuit according to another embodiment of the invention.

FIG. 3 illustrates a schematic diagram of a zero-crossing voltage detection circuit according to another embodiment of the invention. The main different point between the circuit in FIG. 2 and the circuit in FIG. 3 is that the zero-crossing voltage detection circuit 300 further comprises an increment resistor (R5) and a first switch 240. The increment resistor (R5) couples with the first resistor (R1) in series. The first switch 240 couples with the increment resistor (R5) in parallel. The first switch 240 provides a bypass route. That is, when the first switch 240 is turned on, a bypass route is generated to cause the first resistor (R1) to connect to the first emitter 223 of the first transistor 220 through the bypass route. When the first switch 240 is turned off, the increment resistor couples with the first resistor (R1) in series to connect to the first emitter 223 of the first transistor 220.

The increment resistor (R5) provides a hysteresis of a change of the phase voltage (Vphase), so that the zero-crossing detection circuit 300 will not change the zero-crossing voltage signal (V3) because of a small change of the phase voltage (Vphase) to make the converter operation mode stable. Typically, when the operation mode of a converter is changed from a discontinuous conduction mode (DCM) for a light load to a continuous conduction mode (CCM) for a heavy load, there will be a discontinuous conduction mode and continuous conduction mode over the course of coexistence. Because the noise in the phase voltage (Vphase) may cause the zero-crossing detection circuit outputs an unstable zero-crossing voltage signal (V3)

to change the operation mode of converter frequently in the coexistence excessive period, an increment resistor (R5) is connected to the first resistor (R1) to reduce the impact of the noise in the phase voltage (Vphase). In a continuous conduction mode (CCM) for a heavy load, the first switch 240 is turned on, and a bypass route is generated to cause the first resistor (R1) to connect to the first emitter 223 of the first transistor 220 through the bypass route. In a discontinuous conduction mode (DCM) for a light load, the first switch 240 is turned off, the increment resistor (R5) couples with the first resistor (R1) in series to connect to the first emitter 223 of the first transistor 220. Accordingly, a hysteresis is created by the increment resistor (R5).

Figure 4:
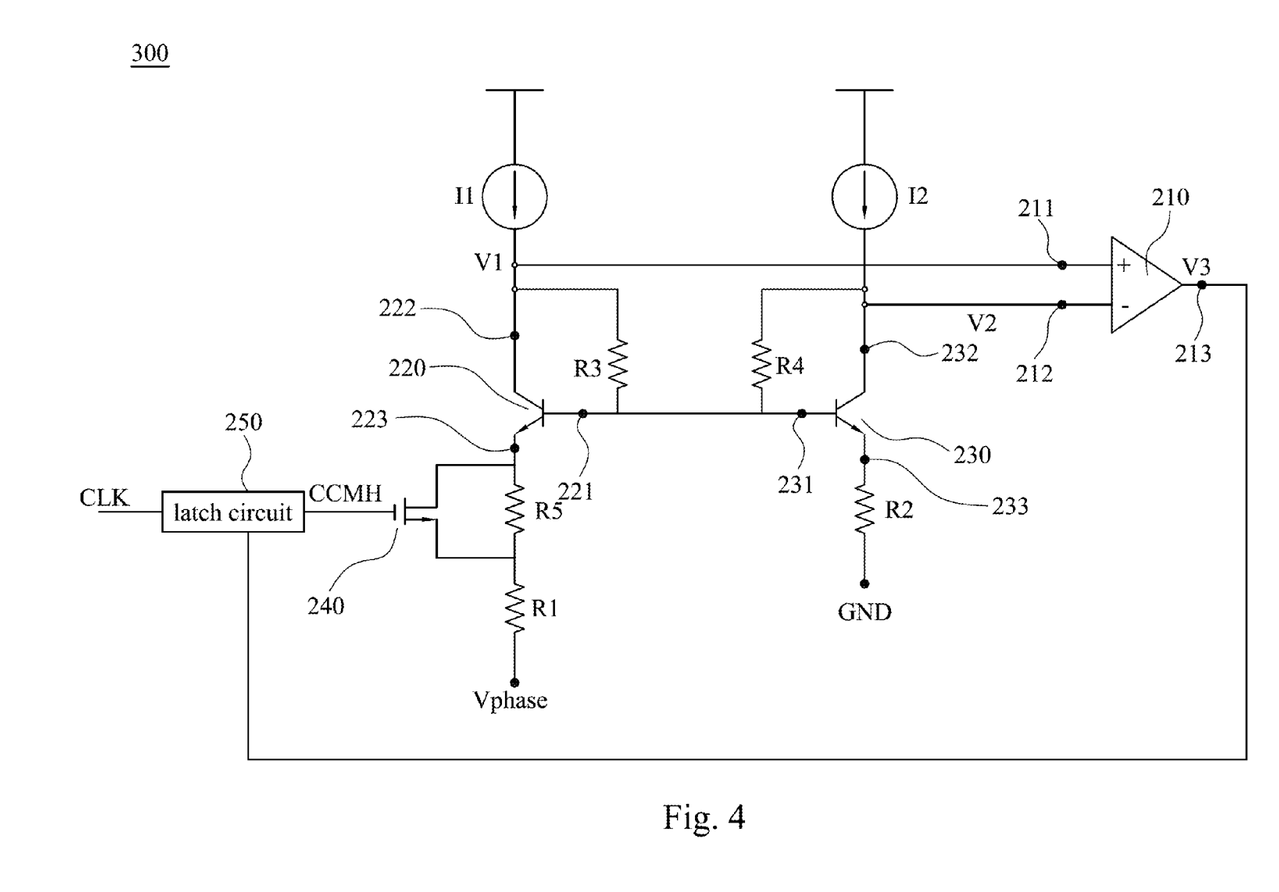
FIG. 4 illustrates a schematic diagram of a zero-crossing voltage detection circuit according to another embodiment of the invention.

FIG. 4 illustrates a schematic diagram of a zero-crossing voltage detection circuit according to another embodiment of the invention. A latch circuit 250 is used to control the on/off of the first switch 240. A zero-crossing voltage signal (V3) from the comparator 210 controls the latch circuit 250. In an embodiment, when the zero-crossing voltage signal (V3) is zero, that is, the phase voltage (Vphase) is equal to the ground voltage (GND), the converter is operated in a critical point between the discontinuous conduction mode of light load and continuous conduction mode of heavy load. At this time, the zero-crossing voltage signal (V3) and the clock signal CLK control the latch circuit 250 to output a low-level voltage signal to turn off the first switch 240. The increment resistor (R5) couples with the first resistor (R1) in series to connect to the first emitter 223 of the first transistor 220. Accordingly, a hysteresis is created by the increment resistor (R5) to reduce the impact of the noise in the phase voltage (Vphase) because the noise may cause the zero-crossing detection circuit to output an unstable zero-crossing voltage signal (V3) to change the operation mode of converter frequently. On the other hand, when the zero-crossing voltage signal (V3) is a signal with a fixed CLK period, the zero-crossing voltage signal (V3) and the clock signal CLK control the latch circuit 250 to output a high-level voltage signal to turn on the first switch 240 to provide a bypass route. The first resistor (R1) couples with the first emitter 223 of the first transistor 220 though the bypass route provided by the first switch 240.

Figure 5:
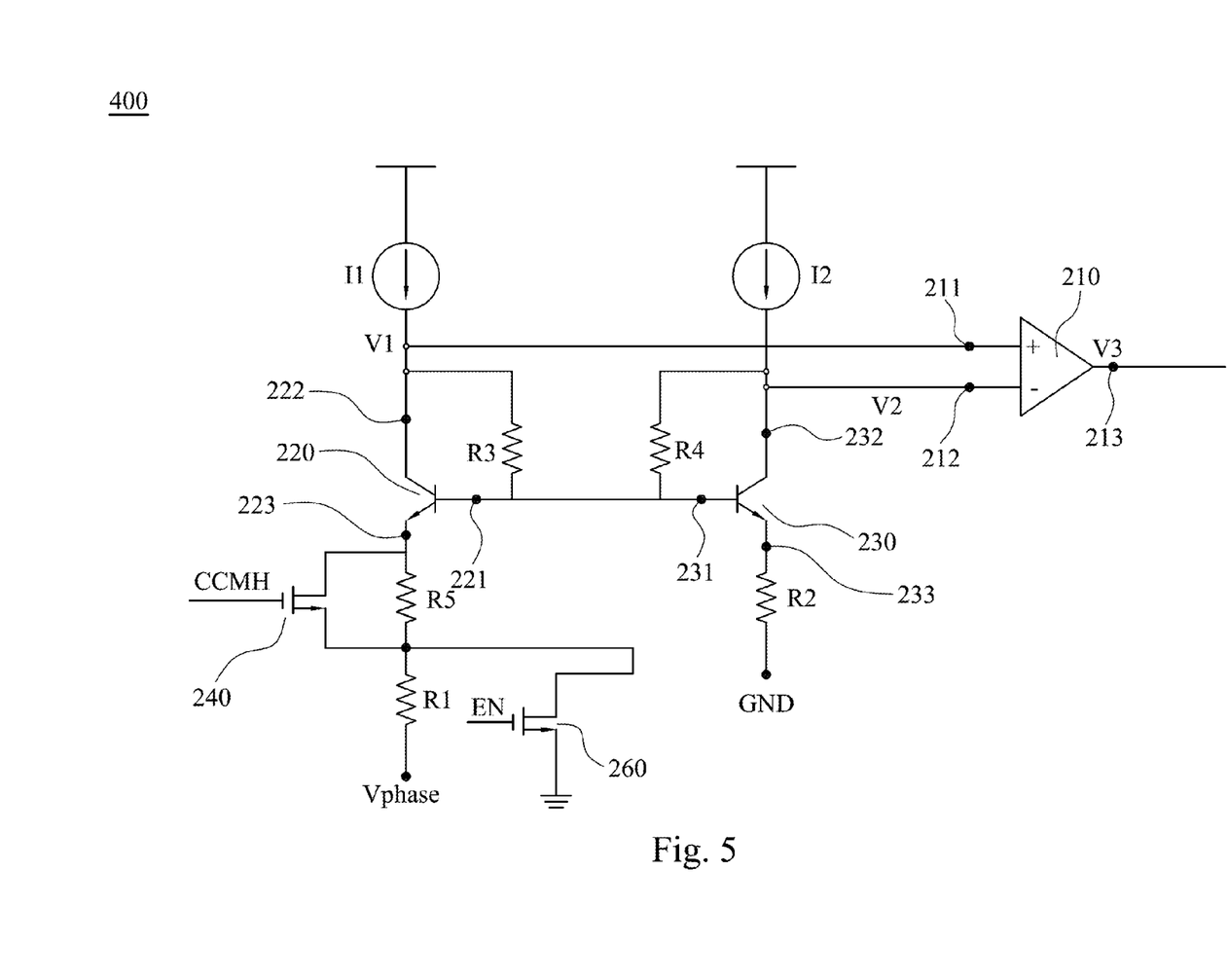
FIG. 5 illustrates a schematic diagram of a zero-crossing voltage detection circuit according to another embodiment of the invention.

FIG. 5 illustrates a schematic diagram of a zero-crossing voltage detection circuit according to another embodiment of the invention. A start switch 260 is used to control the operation of the zero-crossing voltage detection circuit 400 to prevent a high-level state phase voltage (Vphase) to damage the zero-crossing voltage detection circuit 400. When the phase voltage (Vphase) is in a high-level state, a start signal (En) turns on the start switch 260 to generate a bypass route to remove the phase voltage. That is, the first emitter 223 of the first transistor 220 is grounded through the turned-on start switch 260. Because both the first emitter 223 of the first transistor 220 and the second emitter 233 of the second transistor 230 are grounded, the detection function of the zero-crossing voltage detection circuit 400 is stopped. On the other hand, when the phase voltage (Vphase) is in a low-level state, the start signal (En) turns off the start switch 260. The phase voltage (Vphase) is transferred to the first emitter 223 of the first transistor 220 to start the detection function of the zero-crossing voltage detection circuit 400.

Accordingly, the voltage transferred to the comparator is not just a voltage difference between the phase voltage (Vphase) and the ground voltage (GND) but a voltage difference that is enlarged by a factor. By enlarging the difference between the phase voltage (Vphase) and the ground voltage (GND), the inaccuracy detecting because of the comparator's dc offset may be reduced. The comparing velocity of the comparator is also improved. Moreover, the inaccuracy detecting because of the change of phase voltage resulting from time delay for charging capacitors among different operations is also smoothed.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A zero-crossing voltage detection circuit for detecting a phase voltage generated by a DC/DC converter, comprising:
   a comparator having a first terminal and a second terminal;
   a first bipolar junction transistor having a first base, a first collector and a first emitter, wherein the first base couples with the first collector, the first emitter receives the phase voltage, and the first collector provides a first voltage to the first terminal; and
   a second bipolar junction transistor having a second base, a second collector and a second emitter, wherein the second base couples with the first base, the second base couples with the second collector, the second emitter receives a ground voltage, and the second collector provides a second voltage to the second terminal,
   wherein the comparator compares the first voltage with the second voltage to generate a zero-crossing voltage signal,
   wherein the zero-crossing voltage signal determines the DC/DC converter is operated in a continuous conduction mode (CCM) or a discontinuous conduction mode (DCM).

2. The zero-crossing voltage detection circuit of claim 1, further comprising:
   a first current source coupling with the first collector; and
   a second current source coupling with the second collector.

3. The zero-crossing voltage detection circuit of claim 2, wherein a current provided by the first current source is equal to that provided by the second current source.

4. The zero-crossing voltage detection circuit of claim 1, further comprising:
   a first resistor coupling with the first emitter; and
   a second resistor coupling with the second emitter.

5. The zero-crossing voltage detection circuit of claim 4, wherein a resistance of the first resistor is equal to that of the second resistor.

6. The zero-crossing voltage detection circuit of claim 4, further comprising:
   an increment resistor coupling with the first resistor in series; and
   a first switch coupling with the increment resistor in parallel,
   wherein when the first switch is turned on, a bypass route is generated to make the first resistor connect to the first emitter through the bypass route; and
   when the first switch is turned off, the increment resistor couples with the first resistor in series to connect to the first emitter.

7. The zero-crossing voltage detection circuit of claim 6, further comprising a latch circuit to control an on/off of the first switch,
wherein when the converter is controlled in a continuous conduction mode (CCM), the first switch is turned on; and
when the converter is controlled in a discontinuous conduction mode (DCM), the first switch is turned off.

8. The zero-crossing voltage detection circuit of claim 7, wherein when the zero-crossing voltage signal is zero, the latch circuit outputs a low-level signal to turn off the first switch; and when the zero-crossing voltage signal is a clock signal, the latch circuit outputs a high-level signal to turn on the first switch.

9. The zero-crossing voltage detection circuit of claim 1, further comprising:
a third resistor, wherein the first base couples to the first collector through the third resistor; and
a fourth resistor, wherein the second base couples to the second collector through the fourth resistor.

10. The zero-crossing voltage detection circuit of claim 9, wherein a resistance of the third resistor is equal to that of the fourth resistor.

11. The zero-crossing voltage detection circuit of claim 1, further comprising a start switch to receive the phase voltage, wherein when a start signal turns on the start switch, a bypass route is generated to remove the phase voltage through the bypass route; and
when the start signal turns off the start switch, the phase voltage is transferred to the first emitter.

12. A zero-crossing voltage detection method for detecting a phase voltage generated by a DC/DC converter, comprising:
providing a first bipolar junction transistor having a first base, a first collector and a first emitter, wherein the first base couples with the first collector, the first emitter receives the phase voltage, and the first collector provides a first voltage;
providing a second bipolar junction transistor having a second base, a second collector and a second emitter, wherein the second base couples with the first base, the second base couples with the second collector, the second emitter receives a ground voltage, and the second collector provides a second voltage; and
comparing the first voltage with the second voltage to generate a zero-crossing voltage signal,
wherein the zero-crossing voltage signal determines the DC/DC converter is operated in a continuous conduction mode (CCM) or a discontinuous conduction mode (DCM).

13. The zero-crossing voltage detection method of claim 12, further comprising:
providing an increment resistor to couple with the first emitter in series; and
providing a first switch to couple with the increment resistor in parallel.

14. The zero-crossing voltage detection method of claim 13, further comprising providing a latch circuit to control an on/off of the first switch.

15. The zero-crossing voltage detection method of claim 14, further comprising providing a start switch to receive the phase voltage, wherein when a start signal turns on the start switch, a bypass route is generated to remove the phase voltage through the bypass route; and
when the start signal turns off the start switch, the phase voltage is transferred to the first emitter.

* * * * *